(12) United States Patent
Van Der Neut

(10) Patent No.: US 10,193,551 B2
(45) Date of Patent: Jan. 29, 2019

(54) MOUNTING ARRANGEMENT FOR PIEZOELECTRIC SENSOR DEVICE

(71) Applicants: AITO B.V., Zaandam (NL); AITO INTERACTIVE OY, Espoo (FI)

(72) Inventor: Ferdinand Van Der Neut, Amsterdam (NL)

(73) Assignee: AITO BV, Amsterdam (NL)

( * ) Notice: Subject to any disclaimer, the term of this patent is extended or adjusted under 35 U.S.C. 154(b) by 323 days.

(21) Appl. No.: 14/910,875

(22) PCT Filed: Aug. 8, 2014

(86) PCT No.: PCT/IB2014/063803
§ 371 (c)(1),
(2) Date: Feb. 8, 2016

(87) PCT Pub. No.: WO2015/019329
PCT Pub. Date: Feb. 12, 2015

(65) Prior Publication Data
US 2016/0197609 A1    Jul. 7, 2016

(30) Foreign Application Priority Data

Aug. 9, 2013   (EP) .................................... 13179992

(51) Int. Cl.
*H01L 41/04* (2006.01)
*H03K 17/96* (2006.01)
(Continued)

(52) U.S. Cl.
CPC .............. *H03K 17/964* (2013.01); *G01L 1/16* (2013.01); *G01L 5/228* (2013.01); *H03K 2217/96015* (2013.01)

(58) Field of Classification Search
CPC ........ H03K 17/964; H03K 2217/96015; G01L 5/228

See application file for complete search history.

(56) References Cited

U.S. PATENT DOCUMENTS

| 3,935,485 A | 1/1976 | Yoshida et al. |
| 4,138,898 A * | 2/1979 | Dybel ...................... G01B 7/16 |
| | | 73/767 |

(Continued)

FOREIGN PATENT DOCUMENTS

| EP | 0210386 | 2/1987 |
| GB | 2212616 | 7/1989 |
| WO | WO 201158154 | 12/2011 |

OTHER PUBLICATIONS

International Search Report in PCT Application PCT/IB2014/063803, EPO, dated Jan. 9, 2015.

*Primary Examiner* — J. San Martin

(57) ABSTRACT

An apparatus or installation comprises a surface (2) and at least one piezoelectric sensor device (18, 27, 90) that is a piezoelectric touch switch comprising at least one piezoelectric sensor (13), located below the surface (2) so that the surface (2) functions as an overlay to the piezoelectric touch switch, the piezoelectric sensor device (18, 27, 90) configured so that the piezoelectric sensor (13) bends in response to a force or pressure exerted on the surface (2) causing the surface (2) to bend. The apparatus (1) or installation comprises continuously adjustable compression adjusting means (6) that operate on the backer piece (5) to compress the piezoelectric sensor device (18, 27, 90) and the at least one squeezer (7) between the overlay (2) and the backer piece (5), for compensating the surface or mounting tolerances.

13 Claims, 6 Drawing Sheets

(51) Int. Cl.
*G01L 5/22* (2006.01)
*G01L 1/16* (2006.01)

(56) References Cited

U.S. PATENT DOCUMENTS

| | | | | |
|---|---|---|---|---|
| 4,495,434 | A * | 1/1985 | Diepers | G01L 1/146 |
| | | | | 310/338 |
| 4,802,371 | A * | 2/1989 | Calderara | G01L 1/16 |
| | | | | 310/338 |
| 2,144,886 | A1 | 10/2002 | Engelmann et al. | |
| 8,779,315 | B2 * | 7/2014 | Hou | H01H 13/785 |
| | | | | 200/534 |
| 2010/0058875 | A1* | 3/2010 | Baumgartner | G01L 9/008 |
| | | | | 73/723 |
| 2013/0152700 | A1* | 6/2013 | Kamiya | B25J 9/00 |
| | | | | 73/862.043 |
| 2013/0152701 | A1* | 6/2013 | Oka | B25J 9/1633 |
| | | | | 73/862.044 |
| 2013/0233089 | A1* | 9/2013 | Kawai | B25J 13/085 |
| | | | | 73/862.68 |
| 2017/0279034 | A1* | 9/2017 | Matsuzawa | G01L 1/16 |
| 2017/0350771 | A1* | 12/2017 | Chern | G01L 1/144 |

* cited by examiner

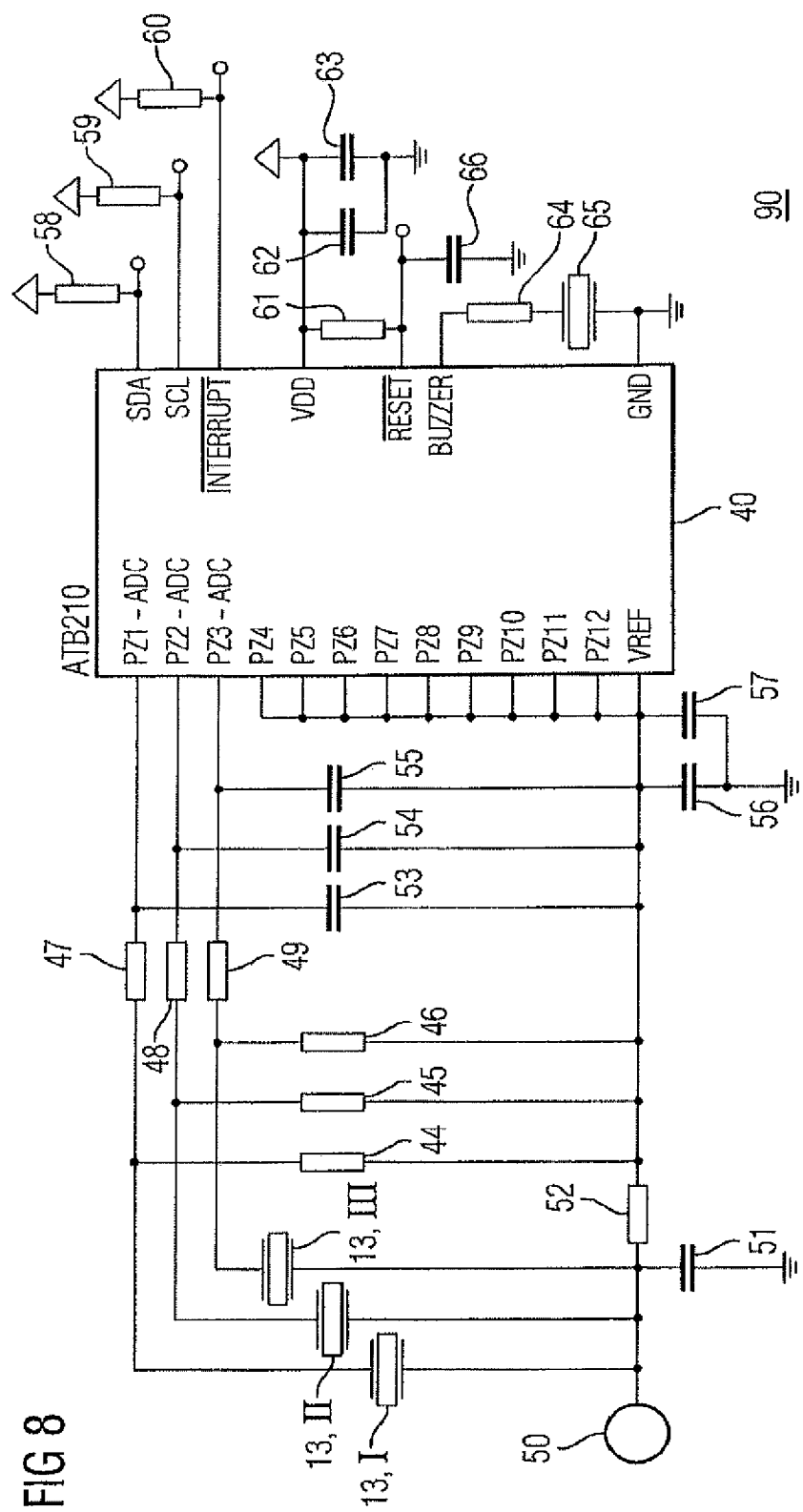

MOUNTING ARRANGEMENT FOR PIEZOELECTRIC SENSOR DEVICE

FIELD OF THE INVENTION

The invention relates to piezoelectric input sensors and to apparatuses and installations in which such piezoelectric sensors are used.

TECHNICAL BACKGROUND

A piezoelectric sensor is a device that uses the piezoelectric effect to measure pressure, acceleration, strain or force by converting them to an electrical charge.

A piezoelectric sensor that can be used to measure pressure, force or strain under a surface (overlay) is known from published patent application WO 2011/158 154 A2 (hereinafter the '154 patent), for example. The piezoelectric sensor comprises a layer of piezoelectric material sandwiched between a PCB and an electrically conductive foil. The electrically conductive foil is attached to the overlay by means of an adhesive layer.

Force, pressure applied to the overlay, or the strain of the overlay, tends to cause a change of shape in the layer of piezoelectric material (generally, the force or pressure tends to bend the layer). The change of shape causes an electrical charge, which is collected via an electrical circuit to signal analysing unit after being converted to digital format. The signal can be analysed by the signal analysing unit, and so the piezoelectric sensor can be used as a piezoelectric touch switch. The piezoelectric touch switch of the kind described in the '154 patent is widely used in different kinds of apparatuses and installations.

It is known that the overlays used in apparatuses and installations can be selected from a very large group of materials and qualities, each having different physical properties. The thickness of the overlay and the material, of which the overlay has been made, for example, can be different for each kind of apparatus or installation. Furthermore, the elasticity of the overlay (i.e. how much the overlay bends if a given force or pressure is exerted on it) may be different. The thickness or elasticity may depend on the position where the piezoelectric sensor switch is assembled, for example, structures show a smaller elasticity close to corners. A displacement of a few millimeters can influence the elasticity or stiffness significantly, in particular if the displacement is towards a stabilizing structure such as a ridge or corner (or further therefrom).

For these reasons, a lot of matching of the piezoelectric sensor set-up between different kinds of apparatuses and installations is currently required in order to have the piezoelectric sensor to work properly. Furthermore, a certain amount of matching may be necessary even between different units of the same make of the apparatus or installation. In particular, if the piezoelectric sensor is a piezoelectric touch switch, tuning is normally required in order to have the switching threshold defined. The aim of the matching is to have the switch not to switch too early (to avoid registering noise as switching, i.e. avoiding false alarms) and to have the switch to switch when a high enough pressure, force or strain is exerted on the overlay (to enable registering a reasonable pressure, force or strain as a valid switching command).

SUMMARY OF INVENTION

It is an objective of the invention to simplify the work that is necessary to match a piezoelectric sensor device that is a piezoelectric touch switch, to an apparatus or installation. The simplification may be seen in a reduction of the need for matching of the piezoelectric sensor on electronics level or on software level. This objective can be fulfilled with the apparatus or installation according to claim 1.

The dependent claims describe advantageous aspects of the apparatus or installation.

ADVANTAGES OF THE INVENTION

The apparatus or installation comprises a surface and at least one piezoelectric sensor device that is a piezoelectric touch switch comprising at least one piezoelectric sensor. The at least one piezoelectric sensor device is located below the surface so that the surface functions as overlay to the piezoelectric touch switch. The piezoelectric sensor device is configured so that the piezoelectric sensor bends in response to a force or pressure exerted on the surface causing the surface to bend.

The piezoelectric sensor device has been assembled by using a piezoelectric sensor device mounting arrangement that comprises a mounting bracket defining at least one opening. The mounting bracket has been attached to the surface from below with attaching means, the at least one piezoelectric sensor being located in the area of the opening. Furthermore, the mounting arrangement comprises at least one backer piece connected to the mounting bracket, and at least one squeezer in the area of the opening between the at least one backer piece and the at least one piezoelectric sensor.

The apparatus or installation further comprises continuously adjustable compression adjusting means that operate on the backer piece to compress the piezoelectric sensor device and the at least one squeezer between the overlay and the backer piece, for compensating the surface or mounting tolerances.

The components of the mounting arrangement have been configured in such a manner that, when the mounting bracket is attached to the surface with the attaching means and the components have been assembled, the piezoelectric sensor device and the at least one squeezer, and also the optional at least sensitivity booster will be compressed between the surface and the backer piece. As the backer piece, a separate plate or other piece (such as grid or net) belonging to an assembly kit of the mounting arrangement can be used, or, alternatively, a structure (in particular plate, grid or net or other piece) in the apparatus or installation can be used.

Thanks to the continuously adjustable compression of the squeezer and of the optional at least one sensitivity booster, the signal seen by electromechanical system (comprising piezoelectric sensor elements and required measurement electronics set-up) can be standardized to the level that ensures optimal signal processing for touch switch functionality in apparatuses and installations with a very large range of physical properties of the surface. Furthermore, a wide range of operational conditions can be achieved since the mounting arrangement is mechanically stable and may show a high temperature stability. This simplifies significantly the work that is necessary to match the piezoelectric sensor device to each apparatus or installation.

An advantage of the mounting arrangement is that the piezoelectric sensor can be integrated at a later stage of product assembly than the configuration disclosed in the '154 patent. This reduces the failure risks due to the product assembly, and improves the freedom of design to locate the piezoelectric sensor device at several places of the end product.

The area of piezoelectric sensor may be smaller or larger than the defined key area which typically is 10 to 20 mm in diameter. The piezoelectric sensor should be triggerable with by initial force levels of 0.1N to 10N exerted by the user on the surface at the defined key area. The force necessary as a valid key input can be adjusted electronically, as defined in our (at the time of writing unpublished) European patent application 13155986.6. The sensitivity value for each piezoelectric sensor may be set by a remote device via communication protocol to control microcontroller in which threshold values have been stored. The triggering force for the key area should preferably be more than 2-10 times larger than the non-active area of the touch switch (outside the defined button area).

The apparatus or installation may further comprise at least one sensitivity booster in the area of the opening between the surface and the at least one piezoelectric sensor.

The improvement may further comprise the step of using a sensitivity booster to improve a force, pressure, or strain transferring contact between the surface and the piezoelectric sensor, and optionally also to mechanically reduce cross-talk between the piezoelectric sensors. This improves the reliability of the piezoelectric sensor device against false alarms.

With the apparatus or installation, the sensitivity of the piezoelectric touch switch can be improved. If the apparatus or installation has a surface manufacturing tolerance of approximately 100 μm, it may be possible to detect a rather small bending of the surface, such as when the surface bends inwards approximately 1 μm, or, more generally, inwards approximately 1 to 10 μm.

The shape of the sensitivity booster may be configured to mechanically lead to a force, pressure or strain-induced deformation of the overlay at the location surrounding a piezoelectric sensor to the piezoelectric sensor. This may increase the reliability of the piezoelectric sensor even with thick or stiff surfaces. Preferably, the sensitivity booster may comprise at least one region with locally increased thickness, such as a hill, a leg or a ridge, at the location of at least one piezoelectric sensor. The sensitivity booster may be a separate piece or it may be integrated in the surface (in particular, if the sensitivity booster is implemented as or comprising at least one area in the surface with bridges or sections milled out).

The shape of the sensitivity booster may have been configured to mechanically prevent a force, pressure or strain-induced deformation of the surface at the location of a piezoelectric sensor from propagating to a neighboring piezoelectric sensor. This improves the reliability of the piezoelectric sensor against false alarms. Therefore, the sensitivity booster may comprise a region with reduced thickness, such as a valley or a recess, at a location around the at least one hill, leg or ridge. Alternatively or in addition, the sensitivity booster may be designed to block forces from outside a user interface area to propagate towards any piezoelectric sensor, preferably by having hills, legs or ridges around the area of the piezoelectric sensor or sensors.

Preferably, the at least one piezoelectric sensor comprises one or more sheets of piezoelectric material placed on substrate that is supported by edges of an opening, enabling the bending of the piezoelectric sensor. In this manner, the sensitivity of the piezoelectric sensor can be increased significantly.

Furthermore, the at least one squeezer may have at least one opening, that in particular may be a recession, to reduce back-coupling of the forces to the piezoelectric sensor and/or to facilitate the bending of the piezoelectric sensor. The opening may be located below the respective piezoelectric sensor, or laterally displaced from the piezoelectric sensor. If the opening is laterally displaced from the piezoelectric sensor, the piezoelectric sensor may be bent with a smaller force even if the piezoelectric sensor has been assembled on a supporting structure, in particular on a printed circuit board.

If the squeezer shows a thermal expansion that is larger than the thermal expansion of the mounting bracket and preferably also that of the backer piece, the squeezer will compress the piezoelectric sensor device against the surface (or against the optional at least one sensitivity booster which in turn is being compressed against the surface) and reduce the possibility of the piezoelectric sensor device losing contact with the surface. This enables using the piezoelectric sensor device in apparatuses or installations in high temperatures. Optimally, the compression of the piezoelectric sensor device and the at least one squeezer and optionally also the at least one sensitivity booster will remain or even increase if the temperature rises, preferably at least in the preferred temperature range from 20° C. to ca. 80-85° C.

The attaching means may be or comprise: i) adhesive on top of the mounting bracket, ii) screws, iii) welding, iv) soldering, and/or v) magnets.

Advantageously, the mounting bracket may be connected to the surface by adhesive, and the sensitivity booster and/or the at least one squeezer are configured to compensate for stiffness or elasticity of the overlay, for geometrical hysteresis, such as due to heat cycling, or for geometrical inaccuracies, such as due to manufacturing tolerances, in such a manner that a reference force, pressure or strain exerted to the overlay generates an output of the at least piezoelectric sensor that is within a pre-defined range, by setting the continuously adjustable compression adjusting means to a defined position. The expected magnitude of signal received at the microcontroller in response to user feedback can therefore have a pre-defined magnitude range, enabling fine-tuning if required, by the manufacturer of the apparatus or the installation, by a remote host using a communication connection or a signalling line, or even automatically.

Preferably, the attaching means adhere to the surface from below in such a manner that the opposite side of the surface remains intact. In this manner, the surface does not need to be pierced, in contrast to the situation that as attaching means screws or bolts are used that need to penetrate through the surface.

Preferably, the surface is a uniform surface. In this manner, especially if the surface is metal or comprises metal, cutting or metal cutting can be avoided. This is particularly useful if the attaching means adhere to the surface from below in such a manner that the opposing side of the surface remains intact, since in this case the surface does not necessarily be treated at all, except potentially polishing, brushing, varnishing and/or lacquering.

BRIEF DESCRIPTION OF THE DRAWINGS

In the following, the invention is described in more detail with the examples shown in the accompanying drawings in FIGS. 1 to 8, of which:

FIG. 8 is an exemplary electronic circuit for operating a piezoelectric sensor device.

Same reference numerals refer to same or similar structural elements in all FIG.

DETAILED DESCRIPTION

Figure 1:
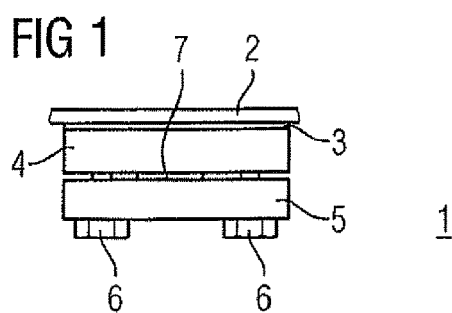
FIG. 1 illustrates a cut of surface of an apparatus or installation, under which a piezoelectric sensor device is located.
Figure 2:
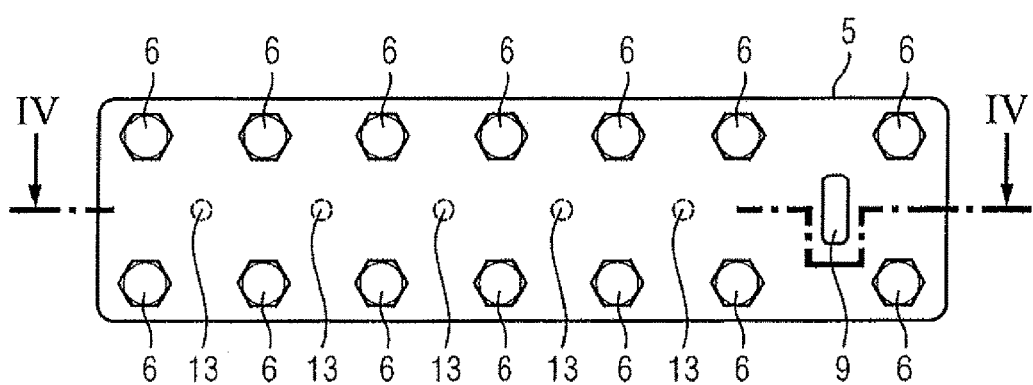
FIG. 2 illustrates the piezoelectric sensor device mounting arrangement as seen from below.
Figure 3:
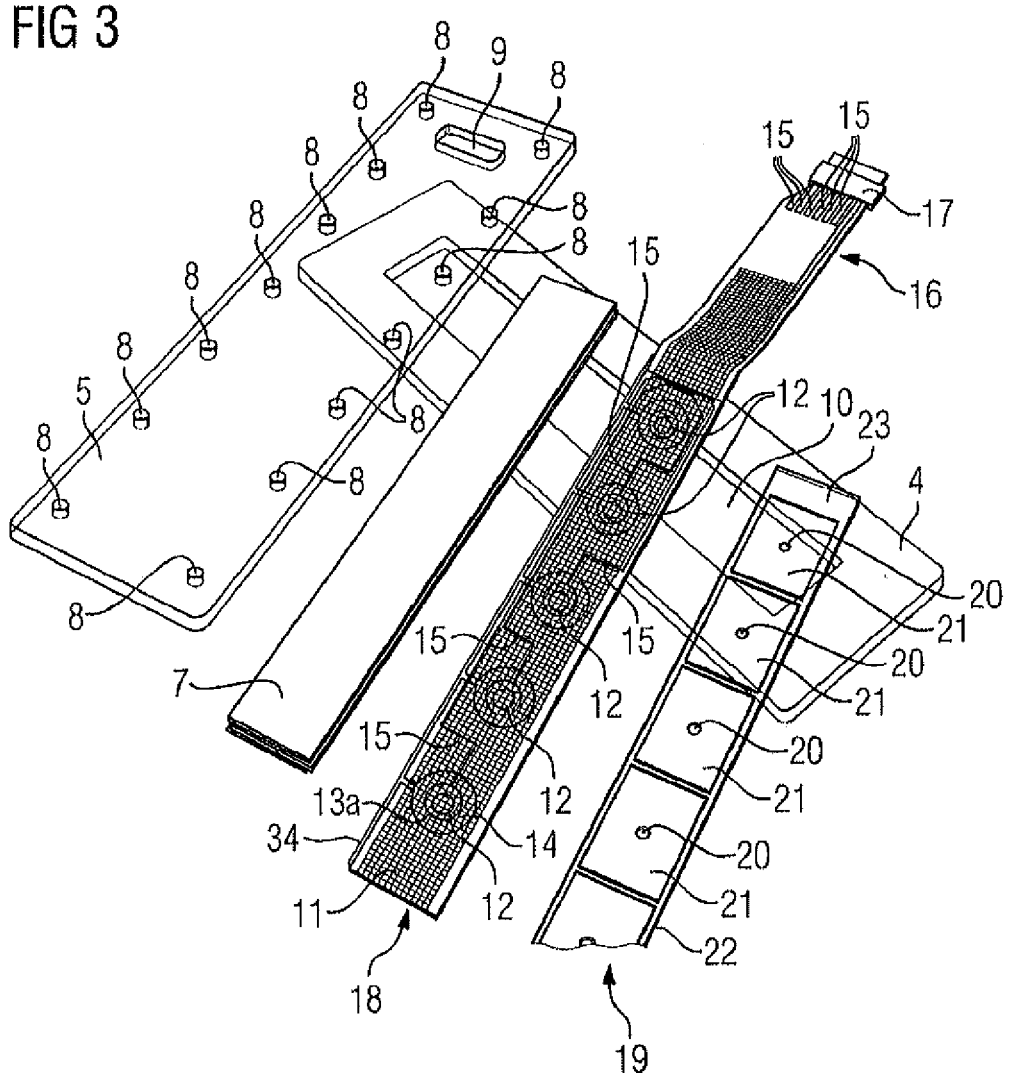
FIG. 3 is an exploded view of components of a first configuration of the piezoelectric sensor device mounting arrangement shown in FIGS. 1 and 2.

FIG. 1 illustrates a cut through surface 2 of apparatus 1 or installation, under which the piezoelectric sensor device mounting arrangement has been attached. FIG. 2 illustrates the piezoelectric sensor device mounting arrangement as seen from below. FIG. 3 is an exploded view of components of a first configuration of the piezoelectric sensor device mounting arrangement shown in FIGS. 1 and 2.

Piezoelectric sensor device mounting arrangement comprises a mounting bracket 4 defining an opening 10, adhesive 3 on top of the mounting bracket 4 for attaching the bracket to the surface 2 (as overlay to the piezoelectric sensors), and at least one backer piece 5.

Furthermore, the piezoelectric sensor device mounting arrangement comprises a piezoelectric sensor device, such as a switch array 18, that comprises at least one piezoelectric sensor 13 (such as a sheet 13a of piezoelectric material on substrate 14) that is placeable or located in the area of the opening 10.

The piezoelectric sensor device mounting arrangement may further comprise at least one sensitivity booster 19 that is placeable or located in the area of the opening 10.

Furthermore, the piezoelectric sensor device mounting arrangement further comprises at least one squeezer 7 that is placeable or located in the area of the opening 10. The squeezer 7 is shown bottom up in FIG. 3.

Preferably, sensitivity booster 19 is made of or comprises aluminium, steel or acrylate. Even though sensitivity booster 19 has been shown as a separate part, it can be an integral part of the surface 2. The sensitivity booster 19 can be produced by moulding or milling, for example.

Preferably, squeezer 7 is made of or comprises rubbery-elastic material, such as rubber. Squeezer 7 can have the shape of a slab (or segments of a slab) or a cushion. Instead of one squeezer 7, there may be a plurality of squeezers 7. The squeezer 7 (or squeezers 7) may be attached to piezoelectric sensor device from below.

The components of the piezoelectric sensor device mounting arrangement have been configured in such a manner that, when the mounting bracket 4 is attached to the surface 2 with the adhesive 3, the sensitivity booster 19, the piezoelectric sensor device (the switch array 18) and the at least one squeezer 7 will be compressed between the surface 2 and the backer piece 5.

Mounting bracket 4 is adhered to surface 2 by adhesive 3. After this, sensitivity booster 19 is placed in opening 10 against the surface 2, after which the piezoelectric sensor device is put in place. Then squeezer 7 is placed below the piezoelectric sensor device. The structure is closed by backer piece 5 which is fastened with screws 6, for example, via openings 10 in the backer piece. The tightness of the piezoelectric sensor device mounting arrangement i.e. the compression of the squeezer 7, the piezoelectric sensor device and the sensitivity booster 19 can conveniently be adjusted by adjusting the tightness of the screws 6. Instead of screws 6, any other, however preferably adjustable, fastening means can be used.

If the fastening means such as screws are replaceable, the mounting arrangement can be opened for replacing the piezoelectric sensor without replacing the surface 2. Because of the adhesive 3, it would be difficult to remove the mounting bracket 4 from the surface 2. If there would be failure of piezoelectric sensor, it would be enough to open the mounting arrangement and replace the piezoelectric sensor, and then close the mounting arrangement.

FIG. 3 shows an exemplary embodiment of the piezoelectric sensor device in which switch array 18 is implemented with sheets 13a of piezoelectric material on substrate 14, with dot 12 on top of each sheet 13a piezoelectric material. On top of switch array 18 is a conductive foil 11.

The substrates 14 are connected to common ground 34 of flat cable 16. Each sheet 13a of piezoelectric material is connected to dedicated conductor 15 of flat cable 16 and can so therefore be read from flat cable connector 17.

The flat cable connector 17 and the respective end of the flat cable 16 are preferably placed outside of the piezoelectric sensor device mounting arrangement. For this purpose, the backer piece 5 may have a suitable opening 9.

As illustrated in FIG. 3, sensitivity booster 19 can be implemented as slab that comprises elevated booster regions such as hills 20. Next to the elevated regions, deeper regions such as valleys 21 are preferably present. Edges of sensitivity booster 19 may be configured as ridges 22. Similarly, ridges 22 may separate neighbour valleys 21 from each other. End zone 23 of sensitivity booster 23 is preferably wider than the ridges 22.

Figure 4:
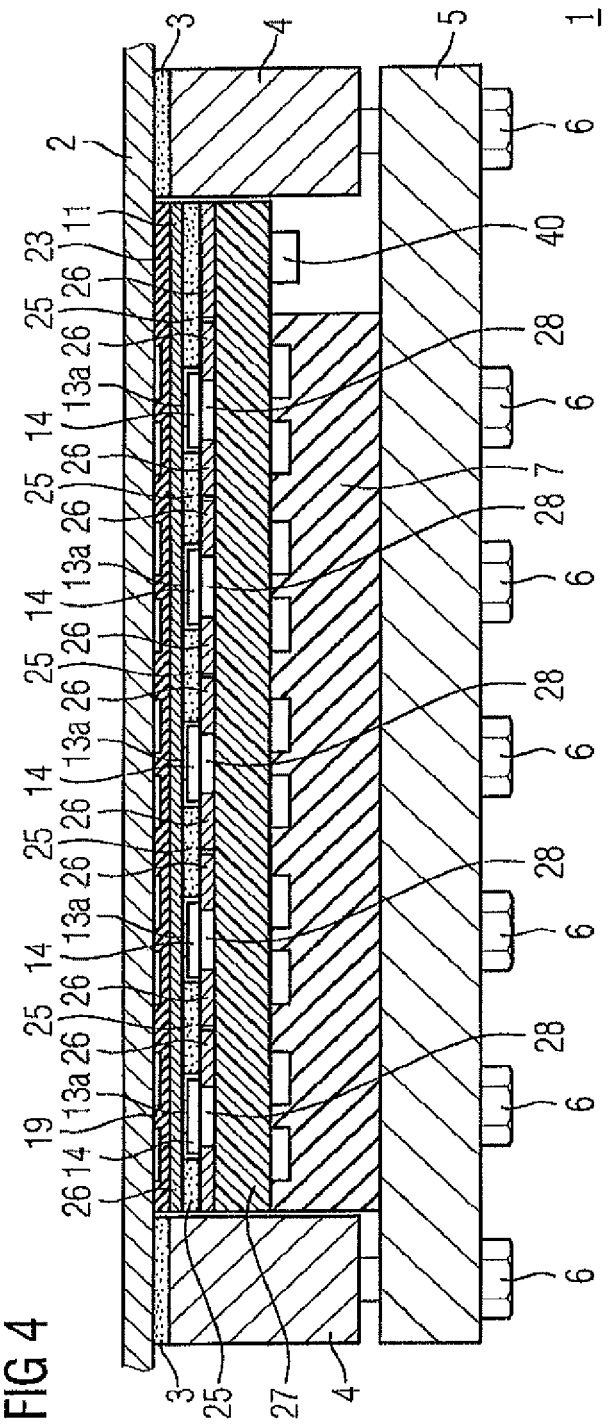
FIG. 4 illustrates section at IV-IV of a second configuration of the piezoelectric sensor mounting arrangement shown in FIG. 2.

FIG. 4 illustrates section at IV-IV of a second configuration of the piezoelectric sensor mounting arrangement shown in FIG. 2, namely, another exemplary embodiment of the piezoelectric sensor device that is a printed circuit board 27 (PCB) based piezoelectric sensor device instead of a switch array 18-based piezoelectric sensor device, the parts of which were illustrated in FIG. 3.

In the piezoelectric sensor mounting arrangement of FIG. 4, no opening 9 for flat cable is required since the signals from piezoelectric sensors 13 are preferably fed to microcontroller 40 located on the PCB 27 and analysed in it.

The PCB 27 can be a flexible PCB or a conductive foil.

Microcontroller 40 can be a separate integrated circuit, a programmable gate array (PGA), a synthesized or integrated microcontroller core in a programmable gate array, a custom application specific integrated circuit (ASIC), or any other device that can execute a program.

Below in the context of FIG. 8 an exemplary electronic circuit 90 for operating a piezoelectric sensor device is disclosed in more detail. The electronic circuit 90 is most conveniently implemented on PCB 27.

Basically, the piezoelectric sensors 13 comprise sheets 13a of piezoelectric material placed on substrate 14. Each of the substrates 14 is supported by edges of opening 28 (cf. FIG. 5) in PCB 27. This enables the bending of the piezoelectric sensor 13.

The sheets 13a of piezoelectric material are covered by conductive foil 11 which is attached to PCB 27 by adhesive 25. The conductive foil 11 acts as common ground. The substrates 14 are connected to PCB contacts 26 and so to electronic circuit 90.

Figure 5:
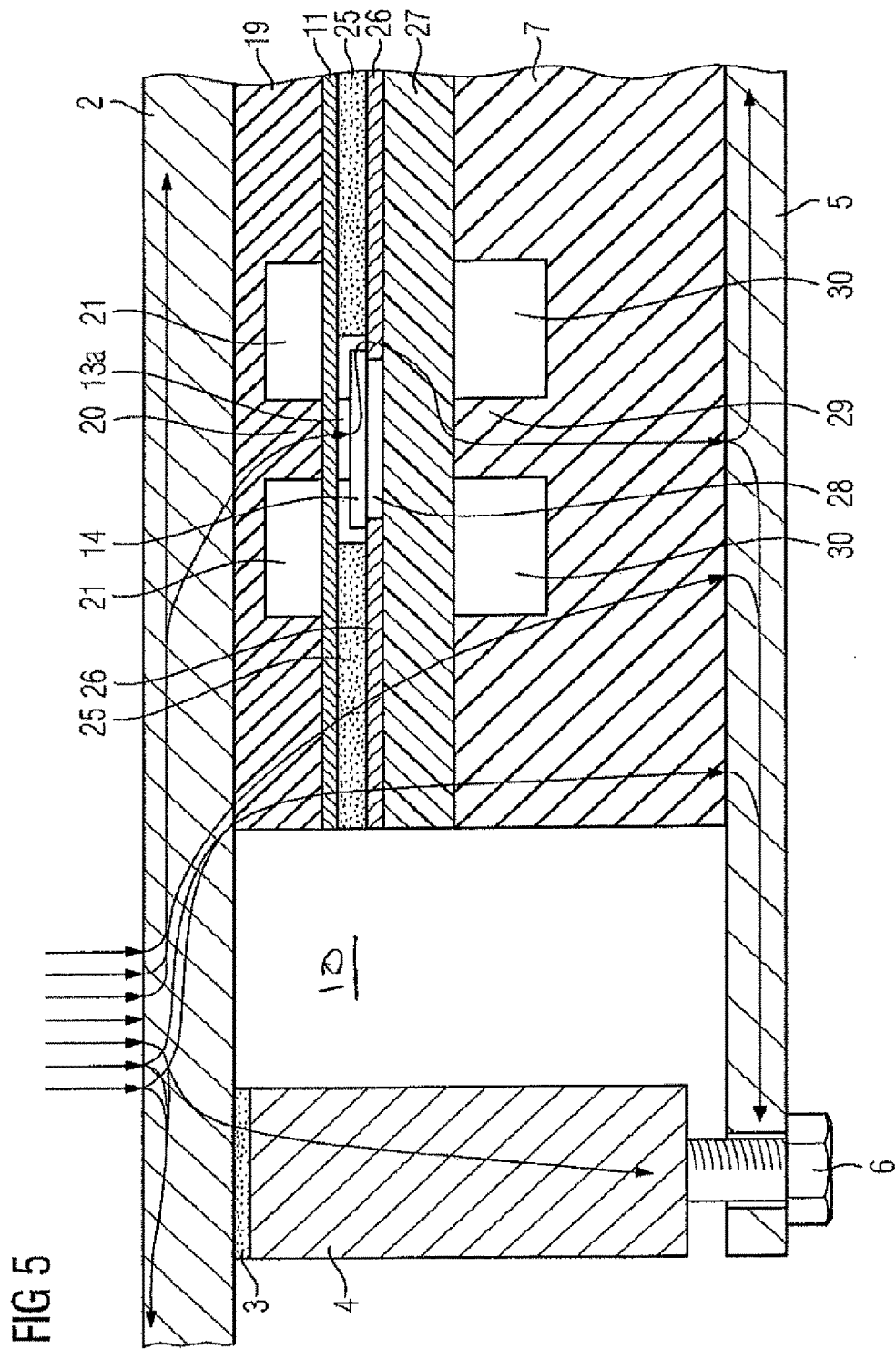
FIG. 5 illustrates force propagation from a force distribution exerted of the surface of the apparatus or installation.

FIG. 5 illustrates propagation of force from a force distribution F exerted of surface 2 of the apparatus 1 or installation at the location shown which is closer to the mounting bracket 4 than to the piezoelectric sensors 13. As can be seen, most of the force distribution F propagates along the surface, through adhesive 3 and mounting bracket 4, or via the sensitivity booster 1, PCB 27 and squeezer 7 to backer piece 5. Only a fraction of the force distribution F passes to the piezoelectric sensor 13.

Therefore, the piezoelectric sensor device mounting arrangement can be seen to act as a barrier to avoid registering noise at the piezoelectric sensors 13 as switching. This helps avoiding false alarms. The mounting arrangement is particularly effective against noise resulting from force distributions outside of the mounting bracket 4. However, the mounting arrangement is still effective also against noise resulting force distributions closer to the mounting bracket 4 than the piezoelectric sensors 13.

The back-coupling of the forces to the piezoelectric sensors 13 can be prevented by form of squeezer 7. The squeezer 7 may therefore have one or more openings 30 (i.e. recessions) located around the sheets 13a of piezoelectric material and hills 29 (such as, for example, legs or the normal height) at the location of the sheets 13a of piezoelectric material. Each opening 30 may be located below the respective piezoelectric sensor 13, and/or laterally displaced from the respective piezoelectric sensor 13.

A further effect of sensitivity booster 19 is that it together with mounting bracket 4 blocks propagation of forces from outside the user interface area that could disturb any one of the piezoelectric sensor elements. Also the squeezer 7 attenuates the propagation of such forces.

Figure 6:
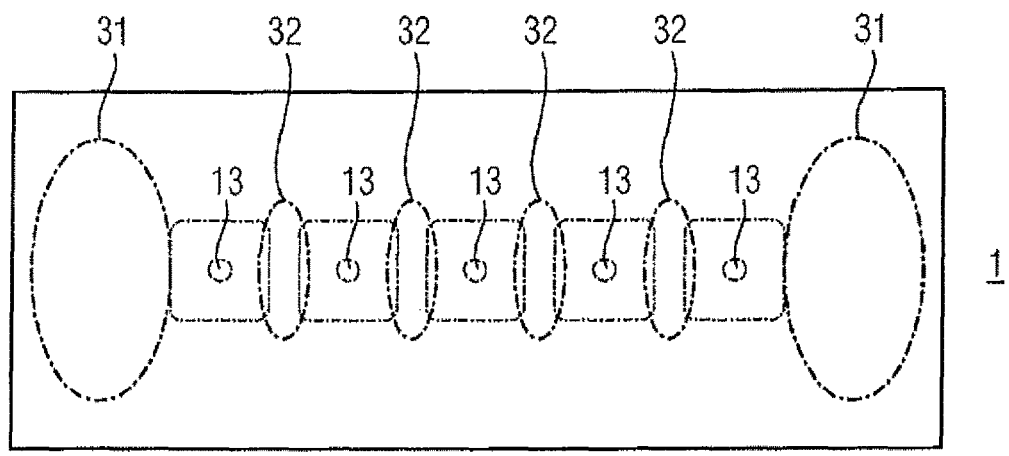
FIG. 6 illustrates preferred regions for mechanical crosstalk reduction.

Actually, as we can see in FIG. 6, force distribution F in FIG. 5 falls in mechanical noise blocking area 31 defined by the piezoelectric sensor device mounting arrangement. Mechanical blocking areas 31 are preferably situated at ends of the PCB 27 or switch array 18. Alternatively or in addition there can be mechanical noise blocking areas 32 between each piezoelectric sensor 13. Mechanical noise blocking areas 31, 32 can also be seen as a means for mechanically reducing cross-talk (or noise, as explained above) between the piezoelectric sensors 13.

Figure 7:
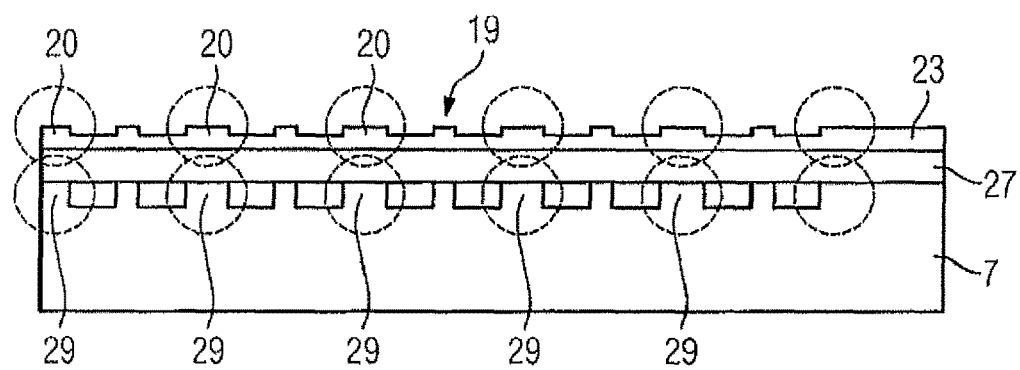
FIG. 7 illustrates a configuration for mechanical crosstalk reduction.

The configuration of mechanically reducing cross-talk between the piezoelectric sensors 13 is schematically illustrated in FIG. 7. The ridges 22 and end zone(s) 23 of the sensitivity booster 19 and the legs of the squeezer 7 reduce cross-talk.

FIG. 8 is a simplified circuit showing certain components of electronic circuit 90 for a piezoelectric sensor device configuration with three piezoelectric sensors 13. The person skilled in the art understands that instead of using three piezoelectric sensors, any number of piezoelectric sensors 13 can be used. Most practically, the number of piezoelectric sensors 13 is 1, 2, 3, 4, 5, 6, . . . to a few dozens. The piezoelectric sensors 13 are most preferably arranged in one-dimensional or two-dimensional arrays.

First piezoelectric sensor element 13, I is connected through resistors 44, 47, 52 between the VREF and PZ1-ADC pins of microcontroller 40. Second piezoelectric sensor element 13, II is connected through resistors 45, 48, 52 between the VREF and PZ2-ADC pins of microcontroller 40. Third piezoelectric sensor element 13, III is connected through resistors 46, 49, 52 between the VREF and PZ3-ADC pins of microcontroller 40.

In the microcontroller 40, PZ1-ADC, PZ2-ADC and PZ3-ADC pins lead to the first, second and third analog-to-digital-converter channels. With this setup, the signal indicating voltage over first piezoelectric sensor element 13, I, second piezoelectric sensor element 13, II and third piezoelectric sensor element 13, III can be converted to digital signals and processed by microcontroller 40.

A voltage which may be 5 Volt DC, is provided to boost converter (not shown in FIG. 8; the realization of the boost converter has been disclosed in European patent application 13155986.6, at the time of writing still unpublished). The purpose of boost converter is to raise the operating voltage across any of the piezoelectric sensors 13 (i.e. 13, I; 13, II; 13, III) up to 200 V (or to other suitably high voltage) to enable it to vibrate enough the surface 2 for tactile signalling. This is achieved via a typical boost (or "step-up") converter circuit, consisting of regular coil, FET, diode and capacitors, along with the switching circuits to direct high voltages to one or multiple of piezo sensors 13 at a time, as controlled by the microcontroller 40. Most preferably, the operating voltage of the piezoelectric sensor 13 that detected the touch switching is raised.

The tactile signalling is preferably used to indicate a valid touch switch interaction. With valid a touch switch interaction is meant that fulfils preset criteria, such as, regarding duration and/or magnitude of the bending of the piezoelectric sensor 13, especially but not limited to exceed a respective lower limit.

In addition to tactile signalling, or instead of it, the buzzer 65 may be used for audibly indicating a valid touch switch interaction. In addition to tactile or audible indication, or instead of them, leds or other suitable light sources such as lamps can be connected, most preferably through resistors 58, 59, 60, for indicating valid touch switch interaction.

Each piezoelectric sensor 13 (such as 13, I; 13, II; and 13, III; or all five piezoelectric sensors 13 such as in the examples in FIGS. 1-4; or all piezoelectric sensors 13 of the piezoelectric sensor device) may be connected to common line VREF via conductive foil 11 from above and connected to printed circuit board 27 via dome 50. Connection from below is connected to corresponding ADC channel of microcontroller 40 (e.g. PZ1-ADC, PZ2-ADC, PZ3-ADC if three piezoelectric sensors 13, I 13, II and 13, III are used) via PCB 27 routing through filtering circuitry (e.g. capacitors 51, 53, 54, 55, 56, 57 and resistors 44, 45, 46, 47, 48, 49, 52 in FIG. 8).

The many features and advantages of the present invention are apparent from the written description. Further, since numerous modifications and changes will be readily apparent to those skilled in the art, the invention should not be limited to the exact construction and operation as illustrated and described. Hence, all suitable modifications and equivalents may be resorted to as falling within the scope of the invention.

LIST OF REFERENCE NUMERALS USED 1 apparatus
2 surface
3 adhesive
4 mounting bracket
5 backer piece
6 screw
7 squeezer
8 hole
9 opening
10 opening 11 conductive foil
12 dot
13 piezoelectric sensor
13a sheet of piezoelectric material
14 substrate
15 conductor
16 flat cable
17 flat cable connector
18 switch array
19 sensitivity booster
20 hill
21 valley
22 ridge
23 end zone
25 adhesive
26 PCB contacts
27 printed circuit board
28 opening
29 hill
30 opening
31 mechanical blocking area (at end)
32 mechanical blocking area (between)
34 common ground
40 microcontroller
44, 45, 46, 47, 48, 49 resistor
50 dome
51 capacitor
52 resistor
53, 54, 55, 56, 57 capacitor
58, 59, 60 resistor
61 resistor
62, 63 capacitor
66 capacitor
64 resistor
65 buzzer
90 electronic circuit

The invention claimed is:

1. A piezoelectric touch switch mounting apparatus (1), comprising:
   an overlay (2) having a top surface and a bottom surface, said overlay configured for being disposed over a piezoelectric touch switch and further configured to bend in response to a pressure exerted on the top surface of the overlay (2);
   at least one piezoelectric touch switch (18, 27, 90), each piezoelectric touch switch (18, 27, 90) comprising at least one piezoelectric sensor (13) and disposed below the bottom surface of the overlay (2), the at least one piezoelectric sensor configured so that the piezoelectric sensor (13) bends in response to a pressure exerted on the overlay (2) causing the overlay (2) to bend;
   a piezoelectric touch switch (18, 27, 90) mount comprising;
   a mounting bracket (4) defining at least one opening (10), the mounting bracket (4) attached proximate a first end to the bottom surface of the overlay (2) with an adhesive attachment element (3) wherein the adhesive attachment element (3) adheres to the bottom surface of the overlay (2) in such a manner that an opposite upper surface of the overlay (2) remains intact and not penetrated by the adhesive attachment element, the at least one piezoelectric touch switch (13) located in the area of the at least one opening (10);
   at least one backer piece (5), disposed proximate a second end of the mounting bracket (4), said second end opposite said first end of the mounting bracket (4);
   at least one squeezer (7) disposed in the at least one opening (10) between the at least one backer piece (5) and a bottom surface of the at least one piezoelectric touch switch (13); and
   one or more continuously adjustable compression adjusters (6) coupled to said mounting bracket (4) and configured to operate on the backer piece (5) to compress the piezoelectric touch switch (18, 27, 90) and the at least one squeezer (7) between the overlay (2) and the backer piece (5) without penetrating the top surface of the overlay (2).

2. The piezoelectric touch switch mounting apparatus (1) according to claim 1, further comprising at least one sensitivity booster (19) disposed in the opening (10) between the surface (2) and the at least one piezoelectric sensor (13).

3. The piezoelectric touch switch mounting apparatus (1) according to claim 1, wherein the at least one piezoelectric sensor (13) comprises one or more sheets (13a) of piezoelectric material placed on substrate (14) that is supported by edges of an opening (28), enabling the bending of the piezoelectric sensor (13).

4. The piezoelectric touch switch mounting apparatus (1) according to claim 1, wherein the at least one squeezer (7) has at least one recess (30), configured to facilitate the bending of the piezoelectric sensor (13).

5. The piezoelectric touch switch mounting apparatus (1) according to claim 4, wherein the at least one opening (30) is located below the piezoelectric sensor (13).

6. The piezoelectric touch switch mounting apparatus (1) according to claim 4, wherein the at least one opening (30) is located laterally displaced from the piezoelectric sensor (13).

7. The piezoelectric touch switch mounting apparatus (1) according to claim 1, wherein: the at least one squeezer (7) includes a thermal expansion that is greater than the thermal expansion of the mounting bracket (4) and the backer piece (5).

8. The piezoelectric touch switch mounting apparatus (1) according to claim 1, wherein: the mounting bracket (4) is connected to the surface (2) by adhesive (3), and wherein one or more of a sensitivity booster (19) and the at least one squeezer (7) are configured to compensate for stiffness or elasticity of the overlay (2), for geometrical hysteresis, such as due to heat cycling, or for geometrical inaccuracies, such as due to manufacturing tolerances, in such a manner that a reference force, pressure or strain exerted to the overlay (2) generates an output of the at least piezoelectric sensor (13) that is within a pre-defined range, by setting the continuously adjustable compression adjuster (6) to a defined position.

9. The piezoelectric touch switch mounting apparatus (1) according to claim 1, wherein the overlay (2) is a uniform overlay.

10. The piezoelectric touch switch mounting apparatus (1) according to claim 1, further comprising signalling means configured to indicate a valid piezoelectric touch switch interaction.

11. The piezoelectric touch switch mounting apparatus (1) according to claim 10, wherein said signalling means comprises means to increase an operating voltage across any one of the at least one piezoelectric sensor (13).

12. The piezoelectric touch switch mounting apparatus (1) according to claim 11, wherein the signalling means is configured to increase the operating voltage across the piezoelectric sensor (13) that detected the piezoelectric touch switch interaction, preferably by using a boost converter that may be controlled by a microcontroller (40)

adapted to read signals from any one or all of the piezoelectric sensor devices (18, 27, 90).

13. The piezoelectric touch switch mounting apparatus (1) according to claim 10, wherein the signalling means comprises one of a buzzer (65) or a light source.

\* \* \* \* \*